United States Patent [19]

Ruehrwein

[11] 3,975,218

[45] Aug. 17, 1976

[54] PROCESS FOR PRODUCTION OF III-V COMPOUND EPITAXIAL CRYSTALS

[75] Inventor: Robert A. Ruehrwein, Garden City, N.Y.

[73] Assignee: Semimetals, Inc., Westbury, N.Y.

[22] Filed: Dec. 13, 1973

[21] Appl. No.: 424,565

Related U.S. Application Data

[63] Continuation-in-part of Ser. No. 248,724, April 28, 1972, abandoned.

[52] U.S. Cl. ............................. 148/175; 148/174; 148/176
[51] Int. Cl.$^2$ ......................................... H01L 7/36
[58] Field of Search .................. 148/175, 174, 176; 117/106 A, 107.2 R; 423/111, 135, 136

[56] References Cited
UNITED STATES PATENTS

| | | | |
|---|---|---|---|
| 3,218,205 | 11/1965 | Ruehrwein | 148/175 |
| 3,224,913 | 12/1965 | Ruehrwein | 148/175 |
| 3,312,570 | 4/1967 | Ruehrwein | 148/175 |
| 3,364,084 | 1/1968 | Ruehrwein | 148/175 |
| 3,462,323 | 8/1969 | Groves | 148/175 |
| 3,493,811 | 2/1970 | Ewing | 148/175 |
| 3,508,126 | 4/1970 | Newman et al. | 148/175 |
| 3,635,771 | 1/1972 | Shaw | 148/175 |

*Primary Examiner*—Walter R. Satterfield

[57] ABSTRACT

A method of forming and epitaxially depositing III-V compound crystals which comprises interacting two gaseous mixtures in the absence of oxidizing gas and hydrogen carrier gas, one mixture being formed by contacting a stream of an inert carrier gas with a gaseous trihalide of a Group III element and thereafter contacting that mixture with the same Group III element, the second mixture being formed by contacting a stream of an inert carrier gas with a Group V element or a volatile Group V compound.

8 Claims, No Drawings

PROCESS FOR PRODUCTION OF III-V COMPOUND EPITAXIAL CRYSTALS

This application is a continuation-in-part of my previous application having the same title, Ser. No. 248,724, filed Apr. 28, 1972, now abandoned.

The present invention relates to an improved method for the production of epitaxial layers of large single crystals of inorganic compounds without requiring the use of hydrogen.

More particularly, this invention relates to a method for the production of epitaxial layers comprising the nitrides, phosphides, arsenides and antimonides of aluminum, gallium, indium and mixtures thereof (hereinafter termed "III-V compounds"). Substrates suitable for these epitaxial films comprise seed crystals of compounds selected from the same class of compounds comprising the epitaxial film, I-VII and II-VI compounds and silicon or germanium.

It is an object of this invention to provide a new and economical method for the production of the above described class of compounds, which are characterized as having a crystalline structure and existing as well-defined single crystals, in which inert carrier gases such as nitrogen, helium or argon may be used in place of the difficult-to-handle hydrogen of the prior art.

A still further object of this invention is the formation and deposition of epitaxial films of the above described materials upon substrates similar the same or different materials in the presence of inert atmospheres.

Prior art methods have generally involved the substantial use of hydrogen, which because of its highly reactive nature, has been a source of danger and expense, involving significant difficulties in handling, complexities in equipment, and time and trouble in manipulation. Despite the obvious and known disadvantages inherent in the use of hydrogen, and despite the knowledge that inert gases at least theoretically could be used as carriers in such reactions, and even in other specialized reactions involving the formation of III-V compounds, the art has nevertheless used hydrogen as the carrier gas in the epitaxial deposition of III-V compounds. I have found that not only is it possible to dispense with hydrogen as a carrier gas or otherwise, but that excellent deposition results are obtained in its absence.

The III-V compounds of the present invention are prepared by interacting two gaseous mixtures comprising as one of them a complex reaction mixture formed by contacting a stream of an inert carrier gas, such as one selected from the group consisting of nitrogen, helium and argon, with a gaseous trihalide of a Group III element, e.g. gallium trichloride, indium tribromide or aluminum triodide, and contacting this carrier gas-Group III trihalide gaseous mixture with the same Group III element at a temperature sufficiently high to react these components. The exact composition of this reaction mixture varies with temperature and pressure but consists essentially of Group III monohalide and Group III trihalide in the carrier gas. The second gaseous mixture is formed by contacting a stream of a similar inert carrier gas with a Group V element or a volatile Group V compound at a temperature insufficient to cause reaction with the carrier gas. At this stage of the process the gas serves primarily as a carrier for the Group V element or compound.

The two gaseous mixtures are then intermixed in a reaction tube at a temperature sufficient to deposit the III-V compound as an epitaxial layer on a seed crystal substrate situated in the reaction tube. In general, the III-V compound deposits from the complex reaction when the latter is subjected to a lower temperature level.

The temperature used in carrying out the reaction between the above described Group III element-Group III trihalide reaction mixture and the Group V component-gas mixture will generally be above about 135°C. to as much as 1500°C., a preferred operating range being from 400°C. to 1300°C. Still more preferred ranges of temperatures for making individual products constituting species within the generic temperature ranges are:

|  | °C. |
|---|---|
| InP | 500–1000 |
| GaP | 700–1200 |
| GaAs | 600–1200 |
| InAs | 500– 900 |
| AlP | 500–1000 |
| AlAs | 700–1200 |
| InSb | 400–500 |
| GaSb | 500– 650 |
| AlSb | 700–1000 |
| AlN | 600–1200 |
| GaN | 700–1200 |

The only temperature requirements are that the temperatures of the tubes leading from the III and V reservoirs be no lower than the temperature of the respective reservoirs. For the Group III trihalides the reservoir temperature is usually within the range of from −100°C. to 600°C., for Group III elements the reservoir temperature is usually within the range of from 135°–1500°C. and for the V element or compound, from −100° to 600°C. The time required for the reaction is dependent upon the temperature and the degree of mixing and reacting. Group III element–Group III trihalide and Group V gaseous components may be introduced individually through nozzles, or may be premixed as desired.

The Group V starting materials include elemental nitrogen, phosphorus, arsenic and antimony and volatile compounds thereof, such as the corresponding hydrides and alkyl compounds.

The present process is, preferably, operated as a continuous flow system. This may constitute a simple reaction tube in which the seed crystal is located and in which a flushing gas (hydrogen may, if desired, be used for this purpose) is then passed to eliminate oxygen from the system. Into this tube are passed the above-described reaction mixtures along the same or one or more additional conduits. The III-V compound formed in the reaction tube deposits as an epitaxial layer on the seed crystal. Various other modifications including horizontal and vertical tubes are also contemplated.

An advantage of the present method for the production of epitaxial layers of III-B – V-B compounds is the ease of obtaining high purity products. In contrast to this method, the conventional method for the preparation of III-V compounds beginning with the respective elements from the group III and Group V series requires a difficult purification technique for the metals. The conventional purification procedures are not as effective when dealing with the metals in contrast to the present invention. For example, the high-temperature vapor-phase reaction employed in the present method inherently introduces another factor favoring the production of pure materials, since the vaporization of the respective Group III and Group V elements or compounds results in a further rejection of impurities. The desired reaction for the production of the III-B – V-B compound occurs between the Group III element-Group III trihalide reaction mixture and the Group V–B element or compound to yield the III–V compound. As a result, it is found that unusually pure materials which are of utility in various electrical and electronic applications, such as in the manufacture of semiconductors, are readily obtained.

In addition, in contrast to the conventional method for the preparation of III–V compounds whereby the compounds are formed at a temperature above their melting points, the compounds produced by the present method are formed at a temperature below their respective melting points, thereby considerably reducing, by as much as three orders of magnitude, the amount of contaminating impurities introduced by reaction with materials from which the reactor equipment is constructed.

Another advantage of the present method of producing epitaxial layers of III-B – V-B compounds is the potentially lower cost of the starting materials. In other methods of producing III-V compounds the starting Group III material is elemental material whereas the present method utilizes Group III halide in addition to the Group III element thereby reducing the cost of the Group III starting material since the cost of contained Group III element is potentially less in the trihalide than it is in the elemental material.

Still another advantage of the present method is the ease of producing mixed crystals or alloys of the III-V compounds. In other methods of producing III–V compounds whereby crystals are grown from the melt, attempts to grow mixed crystals result in materials of non-uniform composition since the composition of the solid is different from that of the melt with which it is in equilibrium. In the present method, the composition of the formed crystal depends on the composition of the reacting gases and in a flow system this can be made invariant. As a result, it is found that uniform materials which are of utility in fabricating, for example, light emitting diodes of uniform wave length of light output are readily obtained.

An important aspect of this invention is the provision of a means of preparing and depositing epitaxial films of the purified single crystal material onto various substrates. These deposited films permit the fabrication of new electronic devices discussed hereinafter. The characteristic feature of epitaxial film formation is that starting with a given substrate material, e.g., gallium arsenide, having a certain lattice structure and oriented in any direction, a film, layer or overgrowth of the same or different material may be vapor-deposited upon the substrate. The vapor deposit has an orderly atomic lattice and assumes the same lattice structure and geometric configuration of the substrate. When using a certain material, e.g., gallium arsenide, as the substrate and another material, e.g., indium phosphide as the layer deposit, it is necessary that lattice distances of the deposit material closely approximate those of the substrate in order to obtain an epitaxial film. In this connection it is pointed out that crystal lattice "mismatches" up to about 40% are tolerable. That is, while, preferably, the crystal lattice of the epitaxial film approximate closely that of the seed crystal substrate, still, epitaxial films are successfully prepared when the crystal lattice spacing of the epitaxial film and the substrate differ by up to 40%.

The seed crystal may have any orientation, e.g., the crystallographic plane exposed to the depositing film may have the (100), (110), (111), (112), (113), etc. crystal faces exposed. However, it has been found that superior epitaxial films result when the seed crystal is oriented (100) or (111)B and, preferably, the (100) orientation. The (111)B crystal face is the (111) face having the Group V element exposed, e.g., in GaAs the (111)B face has arsenic atoms exposed. When other crystal orientations are employed, e.g., (110) or (111)A, the epitaxial films deposited on them are operable, but are more likely to be less smooth and uniform in thickness.

A particular advantage of the present method for the production of epitaxial films of III-B – V-B compounds is that in forming the epitaxial layer on the substrate, the substrate is not affected and therefore sharp changes in impurity concentration can be formed. By this method it is possible to prepare sharp and narrow junctions, such as p-n junctions, which cannot be prepared by the conventional methods of diffusing and alloying.

The thickness of the epitaxial layer may be controlled as desired and is dependent upon reaction conditions such as temperatures within the reactor, gas flow rates and time of reaction. In general, the formation of large single crystals and thicker layers is favored by higher temperatures as defined above, and larger flow rates.

As stated hereinbefore, the epitaxial films formed in accordance with this invention comprise compounds formed from elements of Groups III-B and V-B of the periodic system. Included in this group of compounds are the nitrides, phosphides, arsenides and antimonides of aluminum, gallium and indium. The bismuthides and thallium compounds, while operable, are less suitable. Preferred compounds within this group include gallium arsenide, gallium phosphide, gallium nitride, aluminum arsenide, aluminum phosphide, indium arsenide and indium phosphide. In addition to the use of the above compounds by themselves, mixtures of these compounds are also contemplated as epitaxial layers, e.g., gallium arsenide and gallium phosphide mixed in varying proportions when produced by the instant process produce superior semiconductor compositions.

Other combinations of elements within the above group which are contemplated herein include ternary and quaternary compositions, or mixed binary crystals, such as combinations having the formulae $GaAs_xP_{1-x}$, $InAs_xP_{1-x}$, $GaP_xN_{1-x}$, $AlP_xAs_{1-x}$, $Ga_xIn_{1-x}As$, $Ga_xIn_{1-x}P$, $In_xP$, $In_xGa_{1-x}Sb$, $Ga_xAl_{1-x}P$, $Ga_yIn_{1-y}As_xP_{1-x}$ and $Ga_xAl_{1-x}As$ where $x$ and $y$ have a numerical value greater than zero and less than 1.

Materials useful as substrates herein include the same materials used in the epitaxial layers as just described, and, in addition, compounds of elements of Groups II and VI (II–VI compounds) and compounds of Groups I and VII elements (I–VII compounds), and elements silicon and germanium are suitable substrates. Suitable dimensions of the seed crystal are 1 mm. thick, 10 mm. wide and 15–20 mm. long, although larger or smaller crystals may be used.

As will be described hereinafter, the materials used herein either as layers or substrates or both may be used in a purified state or containing small amounts of foreign materials as "doping" agents.

One significance of structures having epitaxial layers is that electronic devices utilizing juntions may readily be fabricated. Devices utilizing n-p or p-n junctions are readily fabricated by vapor depositing the host material containing the desired amount and kind of impurity, hence, conductivity type, upon a substrate having a different conductivity type. In order to obtain a vapor deposit having the desired conductivity type and resistivity, trace amounts of an impurity, e.g., an element or compound thereof selected from Group II of the periodic system, e.g., beryllium, magnesium, zinc, cadmium and mercury are incorporated into the reaction components in order to produce p-type conductivity, and tin or a tin compound such as tin tetrachloride or an element from Group VI, e.g., sulfur, selenium and tellurium, to produce n-type conductivity. These "impurities" are carried over with the reactant materials in the vapor phase and deposited in a uniform dispersion in the epitaxial film of the formed product on the substrate. Since the proportion of dopant deposited with the III–V compound is not necessarily equal to the proportion in the reactant gases the quantity of dopant added corresponds to the level of carrier concentration desired in epitaxial layer to be formed.

The doping element may be introduced in any manner known in the art, for example, by chemical combination with or physical dispersion within the reactants. Other examples include adding volatile dopant compounds such as $SnCl_4$ to the reservoir of the Group III-B and/or V-B components, or the dopant can be added with a separate stream of carrier gas from a separate reservoir.

The substrate materials used herein may be doped by conventional means known to the art. For example, the doping agent may be introduced in elemental form or as a volatile compound of the dopant element during preparation of the substrate crystal in the same manner described above for doping the epitaxial film. Also, the dopant may be added to a melt of the substrate compound during crystal growth of the compound. Another method of doping is by diffusing the dopant element directly into the substrate compound at elevated temperatures.

The quantity of dopant used will be controlled by the electrical properties desired in the final product. Suitable amounts contemplated herein range from $1\times10^{14}$ to $5\times10^{20}$ atoms/cc of product.

Vapor deposits of the purified material having the same conductivity type as the substrate may be utilized to form $pp^+$ or $nn^+$ regions.

Variations of the preceding techniques permit the formation of devices having a plurality of layers of epitaxial films each having its own electrical conductivity type and resistivity as controlled by dopant concentration. Since the vapor deposited material assumes the same lattice structure as the substrate whereever the two materials contact each other, small or large areas of the substrate may be masked from or exposed to the depositing host material. By this means one is able to obtain small regions of junctions or wide area layers on the substrate for a diversity of electronic applications.

As mentioned above, a plurality of epitaxial layers may be deposited upon the substrate material. This is accomplished, e.g., by vapor depositing consecutive layers one upon the other. For example, a first film of one of the materials described herein, e.g., gallium arsenide, is vapor deposited upon a substrate of germanium. Subsequently, a quantity of the same material with different doping agents or different concentrations of the same dopant or another of the described materials, e.g., indium phosphide, may be vapor deposited from starting materials comprising these elements as a second epitaxial layer over the epitaxial layer of gallium arsenide already deposited on the substrate. This procedure with any desired combination of epitaxial and nonepitaxial layers can be repeated any number of times.

Alternatively, after the first layer of material is vapor deposited upon the substrate, the substrate with this epitaxial layer is removed to another reaction tube and a second material is then vapor deposited as before upon the substrate with its first epitaxial layer, thereby forming a two-layered component.

In each of these processes, the thickness of the film and the impurity concentration are controllable to obtain a variety of electrical effects required for specific purposes, as discussed elsewhere herein.

Various electronic devices to which these epitaxially layered semiconductors are applicable include light emitting diodes, varactor diodes, avalanche diode microwave sources, transferred electron microwave sources, radiation detectors and mixers, solar cells, microwave switches, current limiting devices, tunnel diodes, bipolar transistors, field effect transistors, optical filters, watt meters and other semiconductor devices.

The invention will be more fully understood with reference to the following illustrative specific embodiments.

EXAMPLE 1

This example illustrates the formation and deposition of an epitaxial layer of n-type GaAs on n-type GaAs as the substrate.

A polished seed crystal of n-type GaAs weighing 2.88 g. and containing $5.8\times10^{18}$ carriers/cc. from tellurium dispersed therein is placed in a fused silica reaction tube located in a furnace. The GaAs seed crystal is placed in a silica support inside said tube. The reaction tube is heated to 700°C and a stream of hydrogen is directed through the tube for 15 minutes to remove oxygen from the surface of the GaAs.

A stream of 100 cubic centimeters per minute of nitrogen is then directed through a reservoir of gallium trichloride maintained at about 120°C. thus vaporizing the gallium trichloride. The nitrogen-gallium trichloride gaseous mixture is then directed through a reservoir of elemental gallium maintained at about 800°C. thus reacting with and vaporizing the gallium, which gaseous reaction product is then conducted through a heated tube from the reservoir to the reaction tube containing the GaAs seed crystal.

Meanwhile, a stream of 100 cubic centimeters per minute of nitrogen containing 7 per cent by volume of gaseous arsine is conducted through a separate tube to the reaction tube. The stream of nitrogen containing the arsine conjoins with the gallium-gallium trichloride reaction mixture in the fused silica reaction tube where a reaction occurs in which a single crystal layer of n-type gallium arsenide is formed on the seed crystal of n-type gallium arsenide as an epitaxial layer which exhibits $10^{15}$ carriers (electrons) per cc. The seed crystal after 5 hours weighs 3.44 g. The deposited layer is single crystal in form and oriented in the same fashion as the substrate. In this Example no hydrogen at all is used.

EXAMPLE 2

The same procedure outlined in Example 1 is repeated except that 100 cc/minute of a separate stream of nitrogen containing 30 percent hydrogen is conducted through a separate tube containing a reservoir of phosphorus trichloride heated to about 10°C. so that the resulting mixture is about 66 percent nitrogen, 28 percent hydrogen and 7 percent $PCl_3$. A separate stream of 10 cc/minute of nitrogen containing 0.001 percent hydrogen is conducted through a separate tube containing a body of zinc chloride dopant heated to about 360°C. From the heated tubes the phosphorus trichloride and zinc chloride are carried by the nitrogen carrier on through the tubes to the reaction tube. The separate streams of gas carrying the vaporized $PCl_3$ and zinc chloride conjoin with the gallium-gallium trichloride reaction mixture in the fused silica reaction tube. In this example, a seed crystal of n-type GaP weighing 1.45 g. and containing about $5.5 \times 10^{18}$ carriers/cc. from sulfur dispersed therein is used.

In the reaction tube, the vaporous gallium chloride-gallium reaction mixture reacts with phosphorus vapor formed by the reduction of $PCl_3$ with the small amount of hydrogen and with zinc dopant to form p-type GaP which deposits from the vapor phase onto the seed crystal of n-type GaP. The reaction is allowed to proceed for 1.5 hours, after which the product is removed from the reaction tube, weighed and is found to have increased in weight by 0.01 g. The crystal consists of an overgrowth of single crystal p-type GaP having the same crystal orientation as the n-type GaP substrate, a p-n junction existing at the boundary between the epitaxial overgrowth and the substrate. In the Example only so much hydrogen is used as is needed to reduce $PCl_3$ and $ZnCl_2$ halides. No hydrogen at all is used in the Ga branch. The carrier gas is nitrogen.

EXAMPLE 3

This example illustrates the formation of a product having an n-type InP overgrowth on a high resistivity or semi-insulating (SI) indium phosphide substrate.

The apparatus and procedure outlined in Examples 1 and 2 are used and followed generally, except that the reservoir containing the III-B element, i.e., elemental indium also contains a quantity of an element to be used as the doping agent for the vapor-deposited compound. To the indium in the reservoir is added tin in the amount corresponding to 0.01% of the amount of indium, i.e., a sufficient quantity to yield $1 \times 10^{17}$ carriers/cc. in the deposited product. In a second tube leading to the reaction tube is a reservoir of phosphorus trichloride.

A seed crystal of indium phosphide containing chromium dispersed therein to provide a resistivity of about $10^7$ ohm-cm., is placed in the reaction tube located in the furnace. The furnace is then heated to 900°C. and a stream of hydrogen directed through the reaction tube for about 20 minutes to remove any oxygen present.

The reservoir of elemental indium containing the tin is heated to 1000°C. and the contents are reacted with a stream of 100 cc/minute of a gaseous mixture of about 97 percent helium and about 3 percent indium bromide, provided by passing helium through a reservoir of indium tribromide maintained at a temperature of 300°C., passing through the indium reservoir to the reaction tube. Simultaneously, the second tube containing the phosphorus trichloride is heated to about 10°C. in the presence of a stream of 100 c/minute of nitrogen containing 30 per cent hydrogen. The vaporized phosphorus trichloride is also carried to the reaction tube wherein the $InBr_3$— indium reaction mixture reacts with the phosphorus vapor formed by the reduction of $PCl_3$ with the small amount of hydrogen and in the presence of tin dopant to produce n-type indium phosphide which deposits from the vapor phase as a uniform layer upon the seed crystal of SI indium phosphide. The product shows an epitaxial layer of single crystal indium phosphide having the same crystal orientation as the InP substrate. Here again only so much hydrogen is used as is needed to react with and reduce the halide employed, no hydrogen is used in the In branch, and nitrogen and helium are the carriers.

EXAMPLE 4

This example illustrates the preparation of an indium phosphide substrate having deposited thereon an expitaxial overgrowth of aluminum antimonide.

The procedure described in the preceding example is repeated, except that the seed crystal used is p-type indium phosphide containing about $5.1 \times 10^{17}$ carriers/cc. from cadmium dispersed therein. The reservoir containing the III-B element, aluminum, also contains sufficient tin doping agent to dope the subsequently formed aluminum antimonide to a carrier concentration of about $1 \times 10^{18}$ carriers/cc. The V-B compound used in this example is antimony trichloride. The tube containing the reservoir of antimony trichloride is heated to 130°C. while passing a stream of 100 cc/minute of nitrogen containing 30 per cent hydrogen therethrough, while the aluminum and tin are heated to 700°C. in a stream of a gaseous mixture of about 97 per cent argon and about 3 per cent aluminum trichloride, provided by passing 100 cc/minute of argon through a reservoir of aluminum trichloride maintained at a temperature of 125°C. These separate gaseous streams containing the vaporized reactants are then conducted to the reaction tube which is heated to 600°C. and contains the indium phosphide seed crystal. Here, the vaporized reactants intermix and aluminum antimonide containing the tin doping agent dispersed therein deposits from the vapor phase onto the indium phosphide seed crystal. Again, the deposited layer is single crystal in form and oriented in the same manner as the substrate, a p-n junction being present as in Example 2.

EXAMPLE 5

This example illustrates the procedure for producing a product having a plurality of layers of different electrical properties.

The procedure here is similar to that followed in the preceding examples, and the apparatus is the same.

The reservoir containing the III-B element, gallium, is heated to 800°C. in a stream of a gaseous mixture of about 97 per cent nitrogen and about 3 per cent gallium trichloride, provided by passing 100 cc/minute of nitrogen through a reservoir of gallium trichloride maintained at a temperature of 100°C. while the tube containing a body of elemental arsenic is heated to about 450°C. in a stream of 100 cc/minute of helium to form a mixture of about 96 per cent helium and 4 per cent $As_2$ vapor and a separate tube containing $ZnCl_2$ is heated to about 360°C. in a stream of 10 cc/minute of helium containing 0.001 percent hydrogen. These separate streams containing the vaporized reactants are conducted to the reaction tube which contains a seed crystal of polished elemental germanium doped to a carrier concentration of about $5.8\times10^{18}$ atoms/cc. of phosphorus. In the reaction tube, previously flushed with hydrogen and heated to 700°C., the vaporized reactants combine and react to form p-type gallium arsenide which deposits from the vapor phase onto the n-type germanium seed crystal. The reaction proceeds for about 15 minutes, after which the flow of the separate streams of helium and nitrogen mixture are discontinued temporarily. A fresh supply of arsenic doped with a trace amount of tellurium is added to replace the original arsenic source.

After the fresh source of arsenic is charged to the system, the nitrogen mixture and helium gas supplies are again opened and the arsenic-tellurium source heated to 450°C. Again, the vaporized reactants are carried to the reaction tube, heated to 700°C. In the reaction tube n-type gallium arsenide deposits from the gaseous reaction mixture upon the p-type gallium arsenide layer previously deposited on the n-type germanium seed crystal.

After the reaction has proceeded to completion, the product consists of a substrate of n-type germanium, having successive layers of p-type gallium arsenide and n-type gallium arsenide These deposited layers exhibit the same orientation and single crystal form characteristic of epitaxial films. The product further has an n-p junction between the n-type gallium arsenide and the p-type gallium arsenide and a p-n junction between the latter compound and the n-type germanium substrate. When this example is repeated substituting silicon for germanium, substantially similar results occur.

By this method any number and combination of epitaxial and non-epitaxial layers may be deposited one upon the other.

An alternative to the foregoing procedure is to connect a fourth tube containing a second III-B element reservoir and III-B halide supply to the reaction tube at a point near the junction of the tube containing the first III-B element reservoir and the tube containing the V-B element reactant. The fourth tube is closed off during the first phase of the process, i.e., while the first epitaxial layer is being formed, and thereafter opened to the system while closing off the tube containing the first III-B element.

A still further modification of this invention is to use a mixture of Group III-B elements in one or more reservoirs and/or a mixture of the Group V-B elements in another reservoir(s) and proceed in the usual manner. Illustrations of this modification are shown in the following three examples:

EXAMPLE 6

A polished seed crystal of n-type gallium phosphide containing $5.5\times10^{18}$ carriers/cc. of silicon dispersed therein is placed in the fused silica reaction tube. The tube is heated to 900°C. and a stream of hydrogen is directed through the tube for 15 minutes to remove any oxygen present.

Elemental gallium is placed in one III-B element reservoir and elemental indium is placed in a second reservoir, a gaseous mixture of 97 per cent helium and 3 per cent gallium trichloride, provided by passing 100 cc/minute of helium through another reservoir of gallium trichloride maintained at a temperature of 100°C., is passed through the gallium reservoir and a gaseous mixture of 97 per cent helium and 3 per cent trichloride, provided by passing 100 cc/minute of helium through still another reservoir of indium trichloride maintained at a temperature of 400°C., is passed through the indium reservoir. A stream of 100 cc/minute of a mixture of 93 per cent argon, 7 per cent phosphine, and a small amount of hydrogen selenide is also directed through another tube to the reaction tube containing the gallium phosphide seed crystal. In the reaction tube heated to 900°C., the vaporized components react to form gallium indium phosphide mixed crystal which deposits in single crystal form as an epitaxial layer on the n-type gallium phosphide crystal. The n-type mixed crystal layer has the same crystal orientation as the seed crystal, chracteristic of epitaxial layers and has the formula $Ga_{0.59}In_{0.41}P$.

EXAMPLE 7

This example illustrates the preparation of an epitaxial film of a three component mixed binary crystal of III-V elements on a gallium arsenide substrate.

A seed crystal of gallium arsenide containing $3\times10^{18}$ carriers/cc. from silicon is placed in the fused silica reaction tube which is flushed with hydrogen to remove oxygen. A quantity of gallium is placed in the reservoir for the III-B element, and a mixture of elemental arsenic and red phosphorus containing about 0.1% of tellurium is placed in a second tube connected to the reaction tube. (A variation of this arrangement is to use three tubes connected to the reaction tube, one tube containing the reservoir for III-B element and the remaining two tubes each containing a separate V-B element.

The gallium reservoir is then heated to about 800°C. and a stream of 100 cc/minute of a gaseous mixture of 97 per cent argon and 3 per cent gallium trichloride is passed therethrough, while the tube containing the V-B elements is heated to about 335°–500°C., while a nitrogen stream of 100 cc/minute is directed through it. The vaporized components in both tubes are conducted to the reaction tube containing the seed crystal. In the reaction tube, heated to 700°C., the gallium halide-gallium reaction mixture combines with and reacts with the vaporized arsenic-phosphorus nitrogen mixture containing the tellurium dopant to form a mixed binary compound, having the formula $GaAs_{0.6}P_{0.4}$, which deposits from the vapor phase onto the gallium arsenide seed crystal.

There is uniform crystal orientation in both layer and substrate indicating epitaxial connection of the layer to the substrate.

By varying the flow rates of nitrogen through the respective phosphorus and arsenic reservoirs according to the aforementioned variation of this example, epitaxial films of ternary compositions over the whole range of $GaP_xAs_{1-x}$ are obtained, where X has a value less than 1 and greater than zero.

In accordance with the present embodiment of this invention, epitaxial films of ternary compositions of III-B – V-B elements may be prepared merely by reacting a III-B halide reaction product of one Group III-B element with two Group V-B elements or viceversa, i.e., by reacting two Group III-B elements reacted with III-B halides with one Group V-B element. Thus, epitaxial films of these ternary compositions may be formed by combining a sum of three Group III-B elements and Group V-B elements in any combination.

EXAMPLE 8

This example illustrates the preparation of epitaxial films of quaternary mixed binary crystals of III–V elements.

Elemental gallium is placed in one reservoir and a mixture of arsenic and phosphorus containing a small amount of tellurium is placed in a second reservoir. Both reservoirs are connected to a quartz reaction tube containing a polished seed crystal of sulfur doped GaAs. (This arrangement may be varied a number of ways, e.g., by placing each reactant in separate reservoirs along a common conduit to the reaction tube or each reservoir may have its own conduit to the reaction tube).

A stream of 100 cc/minute of a gaseous mixture of 97 per cent nitrogen and 3 per cent indium chloride is passed through the reservoir containing the gallium which is heated to about 1000°C., and the reservoir containing the tellurium-doped phosphorus-arsenic mixture is heated to about 335°–500°C. while a helium stream of 100 cc/minute is directed through it. The vaporized components in both reservoirs are then conducted through quartz tubes to the reaction tube which is heated to about 900°C. The separate streams carrying the reactants converge in the reaction tube where the indium chloride-gallium reaction mixture is reacted with the helium-phosphorus and arsenic mixture containing tellurium for about 1 hour to form a four-component mixed binary crystal having the formula

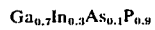

$Ga_{0.7}In_{0.3}As_{0.1}P_{0.9}$ which deposits as an epitaxial film on the GaAs seed crystal.

Similarly, other four-component mixed binary crystals of III—V compounds may be deposited as epitaxial films merely by combining a reaction mixture of III-B halide and at least one Group III-B element with at least one Group V-B element, provided that the sum of the III-B elements and the V-B elements reacted equals four. That is, one, two or three Group III-B elements reacted with a hydrogen halide may be reacted with, respectively, three, two or one Group V-B elements to produce epitaxial layers of the quaternary compositions of III-V elements of this embodiment of the present invention.

EXAMPLE 9

This example illustrates the deposition of an epitaxial layer of indium arsenide onto a substrate of a I–VII compound having the cubic zinc blende structure typified by single crystal copper iodide.

A polished seed crystal of single crystal copper iodide having approximate dimensions of 2 mm. thick, 15 mm. wide and 20 mm. long is placed in a fused silica reaction tube located in a furnace. The reactor is heated to 550°C. and a stream of hydrogen is directed through the tube for 15 minutes to remove oxygen from the system.

A stream of 100 cc/minute of a gaseous mixture of 97 per cent helium and 3 per cent indium chloride is then directed through a reservoir of elemental indium and maintained at about 650°C. thus vaporizing and reacting with the indium which is then conducted through a heated tube containing the copper iodide seed crystal.

Meanwhile, a separate stream of 100 cc/minute of a gaseous mixture of 93 per cent argon and 7 per cent arsine is carried through a separate tube to the reaction tube.

The separate streams of the III halide-indium reaction mixture and arsine mixed with argon conjoin in the fused silica reaction tube where a reaction occurs in which a single crystal form of n-type indium arsenide is formed as a layer-deposit on the single crystal copper iodide substrate.

The deposited layer is single crystal in form and has the same lattice orientation as the substrate, hence, the indium arsenide forms an epitaxial film on the single crystal copper iodide substrate.

While the foregoing example has illustrated the use of single crystal I–VII compounds using copper iodide as the substrate, in a similar manner the fluorides, chlorides, bromides and iodides of copper, silver and gold having the zinc blende structure are likewise used as substrates for epitaxial overgrowths of III–V compounds. Similarly, single crystal I–VII compounds having the cubic sodium chloride type structure may be used as substrate for epitaxial growth of III–V compounds. In this manner, the fluorides, chlorides, bromides and iodides of sodium, lithium, potassium, rubidium and cesium are used as substrates. Preferred I–VII compounds include copper fluoride, copper chloride, copper bromide, copper iodide, and silver iodide.

EXAMPLE 10

This example illustrates the deposition of an epitaxial film of gallium phosphide onto a substrate of a II–VI compound having the cubic zinc blende structure typified by single crystal zinc selenide.

A polished seed crystal of single crystal n-type zinc selenide (doped with boron) having approximate dimensions 2 mm. thick, 10 mm. wide and 15 mm. long is placed in a fused silica reaction tube located in a furnace. The reaction tube is heated to 900°C and a stream of hydrogen is directed through the tube for 15 minutes to remove oxygen therefrom.

A stream of 100 cc/minute of a gaseous mixture of 97 per cent nitrogen and 3 per cent gallium trichloride is then directed through a reservoir of elemental gallium maintained at 800°C. thus reacting with and vaporizing the gallium which is then conducted through a heated tube from the reservoir to the reaction tube containing the zinc selenide seed crystal.

Meanwhile, a separate stream of 10 cc/minute of nitrogen containing 0.001% of hydrogen is conducted through a separate tube containing a body of zinc chloride heated to 360°C. From the heated tube the zinc chloride is carried by the hydrogen on through the tube to the reaction tube. (The hydrogen used is only that required to react with the $ZnCl_2$).

Still another separate tube carries a stream of 100 cc/minute of a mixture of 93 per cent nitrogen and 7 per cent phosphine into the reaction tube. The source of the phosphine may be a pressurized reservoir of the gas or the gas may be generated as needed by reacting aluminum phosphide with water, for example.

The separate streams of the gallium chloride-gallium reaction mixture, the phosphine and $ZnCl_2$-nitrogen mixtures conjoin in the fused silica reaction tube where a reaction occurs in which a single crystal form of p-type gallium phosphide is formed as a film-deposit on the single crystal n-type zinc selenide substrate. The deposited layer is single crystal in form and has the same lattice orientation as the substrate, hence, the gallium phosphide forms an epitaxial film on the single crystal zinc selenide substrate.

While the foregoing example has illustrated the use of single crystal II–VI compounds using zinc selenide as the substrate, in a similar manner the sulfides, selenides and tellurides of beryllium, zinc, cadmium, and mercury are likewise used as substrates for epitaxial overgrowths of III–V compounds. Similarly, single crystal II–VI compounds having the cubic sodium chloride type structure may be used as substrates for epitaxial growth of the III–V compounds. In this manner the oxides, sulfides, selenides and tellurides of magnesium, calcium, strontium and barium, as well as cadmium oxide, are used as substrates. Preferred II–VI compounds include zinc sulfide, zinc selenide, zinc telluride, cadmium sulfide, cadmium selenide, cadmium telluride, mercury sulfide, mercury selenide, mercury telluride, beryllium sulfide, beryllium selenide and beryllium telluride.

It will be seen that the products obtained according to the present invention have a variety of applications. For example, in electronic devices where it is desirable to have a substantially inert non-conducting base for III–V semiconductors, the products described in Examples 3 and 9 are highly suitable. Where it is desired to obtain semiconductor components having semiconducting properties in the base material as well as in the epitaxial film, those products described in other Examples above are of particular value.

Electronic devices may also be fabricated wherein a semiconducting component comprising an epitaxial film of III–V compositions is deposited on substrates of metallic conductors having cubic crystal structure, such as gold, silver, calcium, cerium, cobalt, iron, iridium, lanthanum, nickel, palladium, platinum, rhodium, strontium, thorium and copper, and alloys such as Al-Zn, SbCoMn, BTi and $Cr_2Ti$.

The present invention is useful for producing III–V compounds, per se, which are of utility as semiconductor components in electronic applications. Also, the III–V compounds produced herein can be formed into large single crystals by conventional methods such as the Czochralski method or the Bridgman method to give materials having direct utility in electronic applications.

EXAMPLE 11

This example illustrates the production of III–V compounds, per se, as typified by GaAs.

A stream of a gaseous mixture of nitrogen and gallium trichloride is directed through a fused silica reservoir of elemental gallium maintained at about 780°C thus reacting with and vaporizing the gallium, which gaseous reaction product is then conducted through a heated tube from the reservoir to a fused silica reaction tube heated to 650°C.

A separate stream of helium carrying $AsH_3$ conjoins with the gallium choride-gallium reaction mixture in the fused silica reaction tube where a reaction occurs in which crystalline gallium arsenide is formed on the walls of the reaction tube from which it is readily removed, e.g., by scraping.

The resistivity of a single crystal portion of the deposit is 0.067 ohm-centimeters and it exhibits n-type conduction.

EXAMPLE 12

This example illustrates the formation and deposition of an epitaxial layer of n-type GaAs on n-type GaAs as the substrate, and is similar to Example 1 except that no hydrogen at all is present, not even that coming from the dissociation of the arsine of Example 1.

A polished seed crystal of n-type GaAs weighing 3.18 g. and containing $5.8 \times 10^{18}$ carriers/cc. from tellurium dispersed therein is placed in a fused silica reaction tube located in a furnace. The Ga As seed crystal is placed in a silica support inside said tube. The reaction tube is heated to 700°C. and a stream of hydrogen is directed through the tube for 15 minutes to remove oxygen from the surface of the GaAs.

A stream of 100 cubic centimeters per minute of nitrogen is then directed through a reservoir of gallium trichloride maintained at about 120°C. thus vaporizing the gallium trichloride. The nitrogen-gallium trichloride gaseous mixture is then directed through a reservoir of elemental gallium maintained at about 800°C. thus reacting with and vaporizing the gallium, which gaseous reaction product is then conducted through a heated tube from the reservoir to the reaction tube containing the GaAs seed crystal.

Meanwhile, a stream of 100 cubic centimeters per minute of nitrogen is conducted through a separate tube containing elemental arsenic held at a temperature of about 450°C. to form a mixture of 96 percent nitrogen and 4 percent $As_2$ which is conducted to the reaction tube. The stream of nitrogen containing the arsenic conjoins with the gallium-gallium trichloride reaction mixture in the fused silica reaction tube where a reaction occurs in which a single crystal layer of n-type gallium arsenide is formed on the seed crystal of n-type gallium arsenide as an epitaxial layer which exhibits $10^{15}$ carriers (electrons) per cc. The seed crystal after 5 hours weighs 3.74 g. The deposited layer is single crystal in form and oriented in the same fashion as the substrate.

EXAMPLE 13

This example is similar to Example 6, except that no hydrogen-producing substance such as phosphine is employed. A polished seed crystal of n-type gallium phosphide containing $5.5 \times 10^{18}$ carriers/cc. of silicon dispersed therein is placed in the fused silica reaction tube. The tube is heated to 900°C. and a stream of hydrogen is directed through the tube for 15 minutes to remove any oxygen present.

Elemental gallium is placed in one III-B element reservoir and elemental indium is placed in a second reservoir, a gaseous mixture of 97 percent helium and 3 percent gallium trichloride, provided by passing 100 cc./minute of helium through another reservoir of gallium trichloride maintained at a temperature of 100°C., is passed through the gallium reservoir and a gaseous mixture of 97 percent helium and 3 percent indium trichloride, provided by passing 100 cc./minute of helium through still another reservoir of indium trichloride maintained at a temperature of 400°C., is passed through the indium reservoir. A stream of 100 cc./minute of a mixture of 96 percent argon, 4 percent phosphorus, provided by passing argon through a reservoir of phosphorus at a temperature of 300°C., and a small amount of hydrogen selenide is also directed through another tube to the reaction tube containing the gallium phosphide seed crystal. In the reaction tube heated to 900°C., the vaporized components react to form gallium indium phosphide mixed crystal which deposits in single crystal form as an epitaxial layer on the n-type gallium phosphide crystal. The n-type mixed crystal layer has the same crystal orientation as the seed crystal, characteristic of epitaxial layers and has the formula $Ga_{0.59}In_{0.41}P$.

EXAMPLE 14

This example, similar to Example 9 except that the hydrogen-producing arsine is not employed, illustrates the deposition of an epitaxial layer of indium arsenide onto a substrate of a I–VII compound having the cubic zinc blende structure typified by single crystal copper iodide.

A polished seed crystal of single crystal copper iodide having approximate dimensions of 2 mm. thick, 15 mm. wide and 20 mm. long is placed in a fused silica reaction tube located in a furnace. The reactor is heated to 550°C. and a stream of hydrogen is directed through the tube for 15 minutes to remove oxygen from the system.

A stream of 100 cc./minute of a gaseous mixture of 97 percent helium and 3 percent indium chloride is then directed through a reservoir of elemental indium and maintained at about 650°C. thus vaporizing and reacting with the indium which is then conducted through a heated tube containing the copper iodide seed crystal.

Meanwhile, a separate stream of 100 cc./minute of a gaseous mixture of 96 percent argon and 4 percent arsenic, provided by conducting the argon through an arsenic reservoir held at 450°C., is carried through a separate tube to the reaction tube.

The separate streams of the III halide-indium reaction mixture and arsine mixed with argon conjoin in the fused silica reaction tube where a reaction occurs in which a single crystal form of n-type indium arsenide is formed as a layer-deposit on the single crystal copper iodide substrate. The deposited layer is single crystal in form and has the same lattice orientation as the substrate, hence, the indium arsenide forms an epitaxial film on the single crystal copper iodide substrate.

While the foregoing example has illustrated the use of single crystal I–VII compounds using copper iodide as the substrate, in a siilar manner the fluorides, chlorides, bromides and iodides of copper, silver and gold having the zinc belnde structure are likewise used as substrates for epitaxial overgrowths of III–V compounds. Similarly, single crystal I–VIII compounds having the cubic sodium chloride type structure may be used as substrate for epitaxial growth of III–V compounds. In this manner, the fluorides, chlorides, bromides and iodides of sodium, lithium, potassium, rubidium and cesium are used as substrates. Preferred I-VIII compounds include copper fluoride, copper chloride, copper bromide, copper iodide, and silver iodide.

EXAMPLE 15

This example, similar to Example 11 except that elemental As is used rather than arsine, illustrates the production of III–V compounds, per se, as typified by GaAs.

A stream of a gaseous mixture of nitrogen and gallium trichloride is directed through a fused silica reservoir of elemental gallium maintained at about 780°C. thus reacting with and vaporizing the gallium, which gaseous reaction product is then conducted through a heated tube from the reservoir to a fused silica reaction tube heated to 650°C.

The separate stream of helium carrying elemental arsenic conjoins with the gallium chloride-gallium reaction mixture in the fused silica reaction tube where a reaction occurs in which crystalline gallium arsenide is formed on the walls of the reaction tube from which it is readily removed, e.g. by scraping.

It has been known that hydrogen carrier gas can be dispensed with in connection with the Group V gaseous mixture where the Group V substance is other than a halide, but hydrogen was nevertheless considered a necessity for the Group III gaseous mixture, hydrogen therefore also being present in the deposition portion of the apparatus, even when the use of a trihalide of the Group III substance was suggested. I have here shown the combination of use of a Group III trihalide and the use of an inert carrier gas throughout the apparatus. Hydrogen may be provided in such small amounts as are needed to reduce halides if, but only if, the latter are used, but hydrogen is not used at all as a carrier gas. Moreover, in accordance with the present invention it is no longer necessary that hydrogen be present at all in order for proper reaction and deposition to proceed, thus eliminating the need to use phosphines, arsines, or other Group V substances which dissociate into hydrogen. Hence for the first time a practical and commercial process for the production and deposition of these Group III-V compounds has been taught which eliminates the need for hydrogen carrier gas and even makes it unnecessary to have hydrogen present in any form.

Various other modifications of the instant invention will be apparent to those skilled in the art without departing from the spirit and scope thereof, as defined in the following claims.

I claim:

1. A process for the production and deposition of epitaxial layers comprised of compounds selected from the group consisting of the nitrides, phosphides, arsenides and antimonides of aluminum, gallium, indium and mixtures thereof, onto a substrate material the crystal lattice spacing of which is within about 40% of that of said compounds and being selected from the class consisting of I–VII, II–VI and III–V compounds, germanium and silicon, which comprises A. combining in the vapor phase, while excluding oxidizing gases, first and second separate gas streams, said first gas stream comprising an inert carrier gas and a gaseous mixture formed by the reaction in the absence of hydrogen of a Group III trihalide and a Group III element, said first gas stream being hydrogen-free; and said second gas stream comprising an inert carrier gas and a gaseous substance selected from the group consisting of a Group V element and a volatile Group V compound; and B. contacting the resulting reaction mixture with said substrate at a temperature within the range of from 135° to 1500°C. to deposit a single crystal form of at least one III–V compound as an epitaxial layer on said substrate.

2. The process of claim 1, in which said epitaxial layer comprises gallium arsenide, said gaseous mixture is formed by the reaction of gallium trichloride and elemental gallium, and said gaseous substance comprises elemental arsenic, said substrate comprising gallium arsenide at a temperature within the range of from 600° to 1200°C., thereby to deposit single crystal gallium arsenide as an epitaxial layer on said substrate.

3. The process of claim 1, wherein is also combined in the vapor phase in step (A) a quantity of at least one doping agent sufficient to modify the electrical properties of the layer being deposited.

4. Process according to claim 3, wherein said doping agent is selected from the group consisting of elements and compounds in Groups II, IV, and VI of the periodic system.

5. Process according to claim 4, wherein said Group III trichloride is gallium trichloride, said Group III element is gallium, said Group V element is arsenic, and doping agent is a Group IV element and said substrate is n-type gallium arsenide.

6. The process of claim 1, for the production and deposition of mixed binary crystals, in which the sum of the Groups III and V components in said vapor phase is greater than two.

7. The process of claim 6, wherein said epitaxial layer and said substrate contain a quantity of at least one doping agent sufficient to produce modified electrical conductivity therein.

8. The process of claim 1, for the production and deposition of a plurality of epitaxial layers, in which, after the defined procedure of steps (A) and (B) is carried out to deposit an epitaxial layer on the substrate, the procedure is repeated as many times as the number of epitaxial layers is desired, but with differing amounts of at least one doping agent being also combined in the vapor phase in step (A) to provide modified electrical properties in successive layers.

* * * * *

UNITED STATES PATENT AND TRADEMARK OFFICE
CERTIFICATE OF CORRECTION

PATENT NO. : 3,975,218

DATED : August 17, 1976

INVENTOR(S) : ROBERT A. RUEHRWEIN

It is certified that error appears in the above-identified patent and that said Letters Patent are hereby corrected as shown below:

Abstract page, after "[73] Assignee;" delete "Semimetals, Inc., Westbury, N.Y." and insert --None--.

Signed and Sealed this

Seventeenth Day of May 1977

[SEAL]

Attest:

RUTH C. MASON
Attesting Officer

C. MARSHALL DANN
Commissioner of Patents and Trademarks